(12) United States Patent
Tao et al.

(10) Patent No.: US 11,193,219 B2
(45) Date of Patent: Dec. 7, 2021

(54) TELLURATE CRYSTAL, GROWTH METHOD THEREFOR, AND USE THEREOF

(71) Applicant: SHANDONG UNIVERSITY, Jinan (CN)

(72) Inventors: Xutang Tao, Jinan (CN); Weiqun Lu, Jinan (CN); Zeliang Gao, Jinan (CN); Youxuan Sun, Jinan (CN); Qian Wu, Jinan (CN)

(73) Assignee: SHANDONG UNIVERSITY, Shandong (CN)

( * ) Notice: Subject to any disclaimer, the term of this patent is extended or adjusted under 35 U.S.C. 154(b) by 179 days.

(21) Appl. No.: 16/313,031

(22) PCT Filed: Sep. 30, 2017

(86) PCT No.: PCT/CN2017/104972
§ 371 (c)(1),
(2) Date: Dec. 23, 2018

(87) PCT Pub. No.: WO2018/129962
PCT Pub. Date: Jul. 19, 2018

(65) Prior Publication Data
US 2019/0218686 A1    Jul. 18, 2019

(30) Foreign Application Priority Data
Jan. 12, 2017    (CN) .......................... 201710021372.6

(51) Int. Cl.
*C30B 29/46*    (2006.01)
*C30B 9/12*    (2006.01)
(Continued)

(52) U.S. Cl.
CPC ............ *C30B 29/46* (2013.01); *C01B 19/004* (2013.01); *C30B 9/12* (2013.01); *H01S 3/117* (2013.01)

(58) Field of Classification Search
CPC ......... C01B 19/004; C30B 29/46; C30B 9/12; H01S 3/09415; H01S 3/117; H01S 3/1618; H01S 3/163
See application file for complete search history.

(56) References Cited

U.S. PATENT DOCUMENTS

| 2002/0028740 A1* | 3/2002 | Zou ........................ C03C 19/00 501/9 |
| 2015/0255751 A1* | 9/2015 | Schwamb ............. H01L 51/447 136/256 |

OTHER PUBLICATIONS

Noguera et al. (Refinement of the Crystal Structure of zirconium tritellurate (IV), ZrTe3O8, Z. Kristallogr. NCS 218 (2003): p. 293-294).*

* cited by examiner

*Primary Examiner* — Matthew J Song
(74) *Attorney, Agent, or Firm* — Proi Intellectual Property US; Klaus Michael Schmid

(57) ABSTRACT

The present disclosure relates to tellurite crystals, growing methods of the same, and applications thereof; the crystals a chemical formula of $MTe_3O_8$, wherein M=Ti, Zr, Hf, which belongs to an Ia-3 space group of a cubic crystal system, wherein a transmittance waveband ranges from visible light to infrared light, with a transparency $\geq 70\%$. According to the present disclosure, a growing method of a tellurite crystal is provided, wherein the crystal may be grown using a flux method, a Czochralski method, or a Bridgman-Stockbarger method. The tellurite crystals may be used as an acousto-optic crystal for fabricating an optical modulation device. The present disclosure takes the lead internationally in growing the tellurite single crystals, the size and quality of which sufficiently meet the demands of practical applications of the tellurite single crystals.

4 Claims, 4 Drawing Sheets

(51) Int. Cl.
*H01S 3/117* (2006.01)
*C01B 19/00* (2006.01)

TELLURATE CRYSTAL, GROWTH METHOD THEREFOR, AND USE THEREOF

TECHNICAL FIELD

The present disclosure relates to the technical field of crystal materials, and more particularly relates to tellurite crystals, growing methods of the same, and applications thereof.

BACKGROUND

Acousto-optic effect refers to a phenomenon in which an ultrasonic wave changes a refractive index of a medium to form a distribution periodically changing with time and space, like a phase grating, and diffraction occurs when incident laser passes through the ultrasonic wave-modulated medium, where a frequency, an intensity, a direction and the like of diffracting the laser will change with the ultrasonic wave.

The acousto-optic effect was confirmed by Debye through experiments in the early 1930s; however, the then used mediums for acoustic-optic interaction were usually isotropic, like water and glass, and light came from common non-coherent light sources. Considering that changes in light intensity and light direction induced by such acousto-optic interaction had petty practical values, they were always ignored and undervalued.

Theoretical study and application development of the acousto-optic interaction were first valued and focused on in 1960s when the first solid-state ruby laser in the world emerged. Rapid development of laser and microelectronic technologies, particularly emergence of the ultrasonic delay line having a superb performance, has always been urging buoyant development of acousto-optic devices. Currently, acousto-optic devices have been widely applied to laser beam modulation with remarkable achievements in high density and large bandwidth real-time signal processing processes in time and frequency domains. A burgeoning signal processing technology (acousto-optic signal processing technology) is slowly formed and developed. However, a wider application prospect of the acousto-optic signal processing technology is still grounded on further enhancement of the performance of acousto-optic devices. To achieve this, improvement of methods of designing acousto-optic devices is needed, and more importantly, a novel acousto-optic material with an excellent performance should be developed.

An ideal acousto-optic material should have the following properties: ① large acousto-optic FOM (Figure of Merit) (the power of diffractive light is proportional to the acousto-optic FOM); ② low acoustic attenuation; ③ wide transmittance waveband and high transparency, with a good transmissivity to both incident laser and diffractive laser; ④ high LTD (laser damage threshold), with which, the material can hardly be defected under an action of strong laser; ⑤ easy accessibility to crystals with a large size and a high optical quality; ⑥ stable physical and chemical properties; resistance to deliquescence and decomposition; ⑦ easy fabrication and low cost, etc.

Besides, the laser crystals are important in a wide array of fields such as militance, industry, communication, and medical care, where there are intensive needs. As a core component of a full solid-state laser, the performance of the laser crystal determines the quality of operation properties of the full solid-state laser.

In addition, a multi-functional composite-type crystal material has always been desired. A laser self-Q switching crystal refers to a crystal material that may combine the acousto-optic Q switching performance and the laser performance, which may reduce operation loss of the composite full solid-state laser and improve the operation efficiency thereof; therefore, the laser self-Q switching crystal is an ideal material for fabricating efficient and compact micro type composite full solid-state lasers.

Therefore, it is imperative to seek for a crystal having superb acousto-optic performance and laser performance. Considering that $TeO_2$ has a wide transmittance range and a large acousto-optic FOM while $MO_2$ (M=Ti, Zr, Hf) crystals have a low acoustic attenuation, an excellent thermal property, and a high chemical stability, a tellurite crystal obtained from a combination of $TeO_2$ and an $MO_2$ crystal may act as a new superb high-frequency acousto-optic material. Meanwhile, due to its wide transmittance waveband and low phonon energy, the tellurite crystals may be used as superb laser crystals, particularly used as superb laser self-Q switching crystals.

SUMMARY

To address the drawbacks in the prior art, the present disclosure provides novel tellurite crystals, growing methods of the same, and applications thereof.

Explanations of the Terms

The crystals described herein should be construed as single crystals, unless specifically indicated as polycrystals.

A technical solution of the present disclosure is provided below:

A tellurite crystal, having a chemical formula of $MTe_3O_8$, wherein M=Ti, Zr, Hf, which belongs to an Ia-3 space group of a cubic crystal system, wherein a transmittance waveband ranges from visible light to infrared light, with a transparency ≥70%.

According to the present disclosure, preferably, the tellurite crystal is further doped with a rare earth element (Re), wherein an amount of the doped rare earth element is controlled within 0<Re/M≤1, the mole ratio is preferably 5%; the chemical formula of the tellurite crystal doped with the rare earth element is Re: $MTe_3O_8$, M=Ti, Zr, Hf.

Further preferably, the rare earth element is La, Ce, Pr, Nd, Sm, Eu, Gd, Tb, Dy, Ho, Er, Tm, Yb and/or Lu.

According to the present disclosure, preferably, the transmittance waveband is 300~6500 nm.

According to the present disclosure, a growing method of the tellurite crystal is provided, wherein the crystal may be grown using a flux method, a Czochralski method, or a Bridgman-Stockbarger method.

According to the growing method of the tellurite crystal according to the present disclosure, the crystal is grown using the flux method, comprising steps of:

(1) compounding raw materials $MO_2$ (M=Ti, Zr, Hf) and $TeO_2$ according to an $MTe_3O_8$ stoichiometric ratio, homogeneously mixing and tableting, sintering at 500° C.~650° C. for 20~40 h, cooling, grinding, and then sintering at 600~700° C. for 20~40 h, obtaining a pure-phase tellurite polycrystal; adding the pure-phase tellurite polycrystal to a flux system, then obtaining a crystal growth material;

or, compounding raw materials $MO_2$ (M=Ti, Zr, Hf) and $TeO_2$ according to an $MTe_3O_8$ stoichiometric ratio, directly adding them to the flux system, homogeneously mixing, thereby obtaining a crystal growth material;

the flux system is selected from one of the following substances, but not limited thereto:

(a) $TeO_2$;
(b) $A_2CO_3$—$TeO_2$ (A=Li, Na, K, Rb or/and Cs), wherein the mole ratio between $M_2CO_3$ and $TeO_2$ is 2: (1~5);
(c) $MoO_3$;
(d) $B_2O_3$;
(e) PbO—$B_2O_3$;

the mole ratio between the tellurite and the flux system is 1: (1~5);

(2) putting the crystal growth material obtained in step (1) in a platinum crucible, rapidly heating to melt it completely, stirring sufficiently and homogeneously, cooling slowly to facilitate the crystal to be nucleated spontaneously and to grow;

or, putting the crystal growth material obtained in step (1) in a platinum crucible, rapidly heating to melt it completely, stirring sufficiently and homogeneously, cooling slowly to a saturation point of the solution, feeding a tellurite seed crystal to perform crystal transformation, cooling slowly to facilitate the crystal to grow; wherein a temperature range for the crystal growth is 750~900° C., and a cooling rate is 0.01~5° C./h.

According to the growing method of the tellurite crystal of the present disclosure, preferably, crystal transformation parameters of tellurite crystal growth in step (2) are: rotational speed: 5~50 rd, acceleration time 1~10 s, operation time 30~180 s, and interval time 5~50 s.

According to the growing method of the tellurite crystal of the present disclosure, preferably, a cooling procedure during growing of the tellurite crystal in step (2) comprises: cooling to 750~850° C. at a rate of 0.01~4° C./h with a growth period: 40~70 days.

According to the present disclosure, the obtained tellurite single crystal has a length ≥20 mm and a thickness ≥10 mm.

According to the present disclosure, the crystal may also be grown using a melt method such as a Czochralski method and a Bridgman-Stockbarger method, which are prior art and will not be detailed.

According to the growing method of the tellurite crystal of the present disclosure, preferably, in the step (1), the rare earth element material $Re_2O_3$, the $MO_2$ (M=Ti, Zr, Hf), and the $TeO_2$ are compounded together according to a certain proportion, obtaining a rare earth element-doped crystal growth material. Growth through the step (2) results in a rare earth element-doped tellurite crystal.

According to the present disclosure, the tellurite crystal as an acousto-optic crystal is applied to fabricate an optic modulation device; further preferably, the optical modulation device is an acousto-optic modulator, an acousto-optic deflector, or an acousto-optic Q switching device.

Preferably, further uses of the tellurite-optic crystal include:
using the tellurite crystal as a laser substrate material;
using the tellurite crystal as a Raman laser crystal;
using the tellurite crystal as a window material;
using the tellurite crystal as a prism material;
using the tellurite crystal as a single crystal substrate;
using the tellurite crystal as a dielectric material;
using the tellurite crystal as an insulating material;
using the tellurite crystal as a catalytic material;
using the tellurite crystal as a high energy particle detection material.

The method for growing a crystal according to the present disclosure is not demanding on growth conditions and is easily implemented; the obtained centimeter-order tellurite single crystal sufficiently meets the demands of orientation processing and eigen feature testing; besides, the raw chemical materials used in the crystal growing method of the present disclosure are directly available in the market with a low price.

For a tellurite single crystal grown with the method of the present disclosure, its X-ray powder diffraction pattern derived from experiments tallies with a standard X-ray powder diffraction pattern derived from theoretical calculation, indicating that the grown crystal is a tellurite crystal of a cubic crystal system.

The present disclosure has the following beneficial effects:

"1. The prior art is only limited to the structure of a tellurite crystal, while the present disclosure takes the lead internationally in growing tellurite single crystals, the size and quality of which sufficiently meets the demands of practical applications of the tellurite single crystals.

2. Comprehensive testing on important eigen features of the large-size, high-quality, grown tellurite single crystals shows that they have a wide application prospect.

3. The tellurite single crystal according to the present disclosure has stable physical and chemical properties and is resistant to deliquescence and decomposition. Besides, the period for crystal growth may be adjusted according to practical needs to obtain a tellurite single crystal of an actually needed size, available for relevant industrial applications.

where 1, 7, 12 represent a laser diode, 2, 8, 13 represent a focusing system, 3, 14 represent a concave mirror, 4 represents Nd:$YVO_4$/Nd:YAG laser crystal, 5 represents a $TiTe_3O_8$ acousto-optic medium, 6, 9, 11, 16 represent a planar mirror, 10 represents Yb: $TiTe_3O_8$ laser crystal; 15 represents a Yb: $TiTe_3O_8$ laser self-Q switching crystal.

DETAILED DESCRIPTION OF EMBODIMENTS

Hereinafter, the technical solution according to the present disclosure is further illustrated with reference to the preferred embodiments, but not limited thereto.

Embodiment 1: Growth of Titanium Tellurite Seed Crystal

Figure 1:
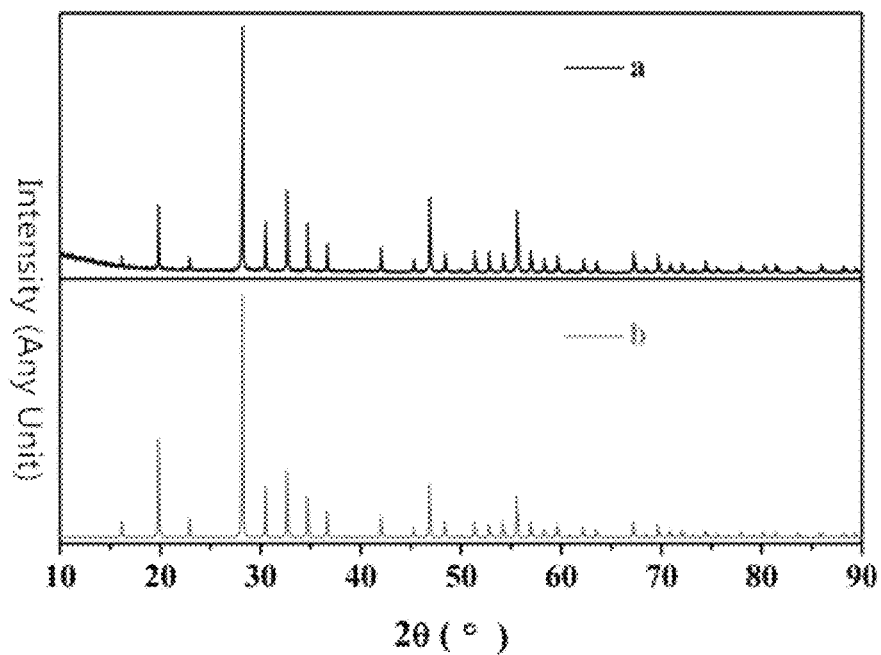
FIG. 1 shows an experimental X-ray powder diffraction pattern of a titanium tellurite polycrystal grown according to embodiment 1 of the present disclosure and a standard X-ray powder diffraction pattern obtained from theoretical calculation (a denotes the experimental X-ray powder diffraction pattern, and b denotes the result obtained from the theoretical calculation)
Figure 2:
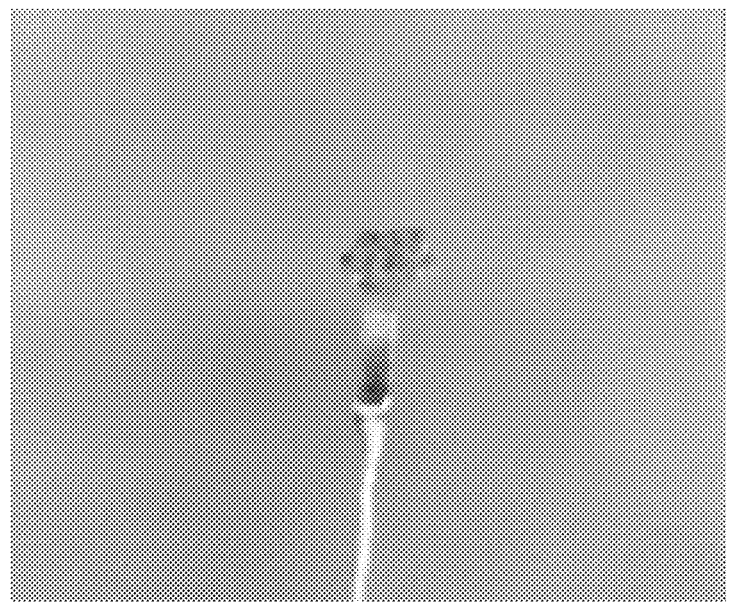
FIG. 2 is a picture of a titanium tellurite seed crystal prepared according to Embodiment 1.

Compounding the raw materials $TiO_2$ and $TeO_2$ according to the $TiTe_3O_8$ stoichiometric ratio, adding them to a flux system $Li_2CO_3$—$TeO_2$ (the $Li_2CO_3$:$TeO_2$ mole rate is 2:3), where the mole rate between the titanium tellurite and the flux system is 1:3, placing them into a platinum crucible with a volume of Φ50 mm×70 mm, rapidly heating to 980° C. to completely melt the raw materials, homogeneously stirring; sinking a platinum rod and performing crystal transformation, slowly cooling to the saturation point of the solution, wherein the cooling rate is 0.55° C./h and the growth period is 5 days; pulling up a seed crystal rod to obtain an orange-colored polycrystal (as shown in FIG. 2). The experimental X-ray powder diffraction pattern is tested to be coincident with the result derived from theoretical computation (as shown in FIG. 1), indicating that what is obtained is the titanium tellurite crystal of a cubic crystal system, where a small crystal of good quality is selected therefrom as a seed crystal for a crystal with a relatively large growth size.

Embodiment 2: Growth of Titanium Tellurite Single Crystal

Figure 3:
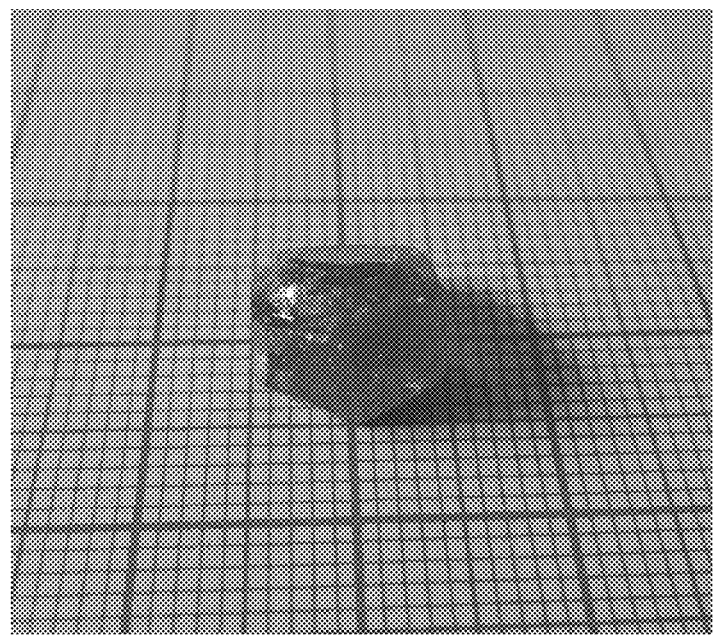
FIG. 3 is a picture of a titanium tellurite single crystal prepared according to Embodiment 2.

Compounding the raw materials $TiO_2$ and $TeO_2$ according to the $TiTe_3O_8$ stoichiometric ratio, adding them to a flux system $Li_2CO_3$—$TeO_2$ (the $Li_2CO_3$:$TeO_2$ mole rate is 2:3), where the mole rate between the titanium tellurite and the flux system is 1:3, placing them into a platinum crucible with a volume of Φ50 mm×70 mm, rapidly heating to 980° C. to completely melt the raw materials, homogeneously stirring; slowly cooling to the saturation point of the solution; performing crystal growth with the small crystal obtained in Embodiment 1 as the seed crystal, wherein the cooling rate is 0.25° C./h and the growth period is 10 days, thereby obtaining an orange-colored bulky single crystal (as shown in FIG. 3). Testing on the experimental X-ray powder diffraction pattern shows a coincidence with the result derived from theoretical computation, indicating that what is obtained is the titanium tellurite crystal of the cubic crystal system.

The titanium tellurite single crystal obtained from embodiment 2 is orientation-processed into a wafer of a desired size; testing of its transmittance spectrum shows that it has a wide transmittance waveband (480~6000 nm).

The crystal is placed in the air for 6 months, without deliquescence or decomposition, indicating that the physical and chemical properties of the crystal are stable.

Embodiment 3: Growth of Titanium Tellurite Single Crystal

Figure 4:
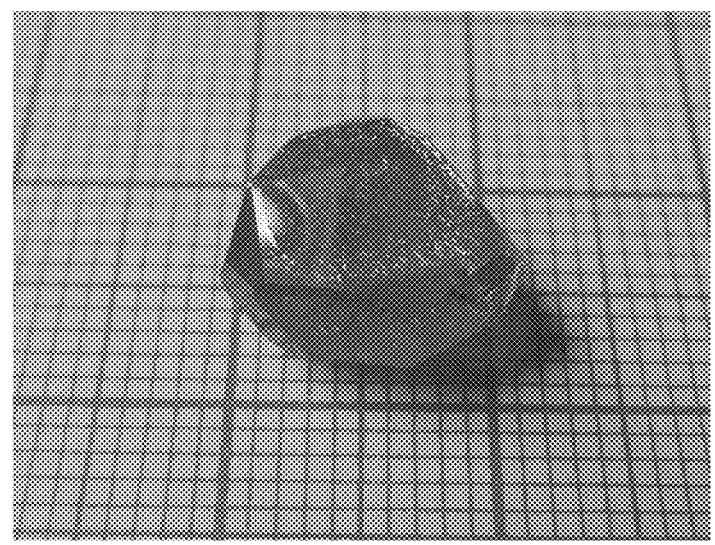
FIG. 4 is a picture of a titanium tellurite single crystal prepared according to Embodiment 3.

Compounding the raw materials $TiO_2$ and $TeO_2$ according to the $TiTe_3O_8$ stoichiometric ratio, adding them to a flux system $Li_2CO_3$—$TeO_2$ (the $Li_2CO_3$:$TeO_2$ mole rate is 2:3), where the mole rate between the titanium tellurite and the flux system is 1:3, placing them into a platinum crucible with a volume of Φ50 mm×70 mm, rapidly heating to 980° C. to completely melt the raw materials, homogeneously stirring; slowly cooling to the saturation point of the solution; performing crystal growth with a crystal along [100] direction as the seed crystal, wherein the cooling rate is 0.06° C./h and the growth period is 20 days, thereby obtaining orange-colored bulky single crystal (as shown in FIG. 4). Testing on the experimental X-ray powder diffraction pattern shows a coincidence with the result derived from theoretical computation, indicating that what is obtained is the titanium tellurite crystal of the cubic crystal system.

Embodiment 4: Growth of Titanium Tellurite Single Crystal

Figure 5:
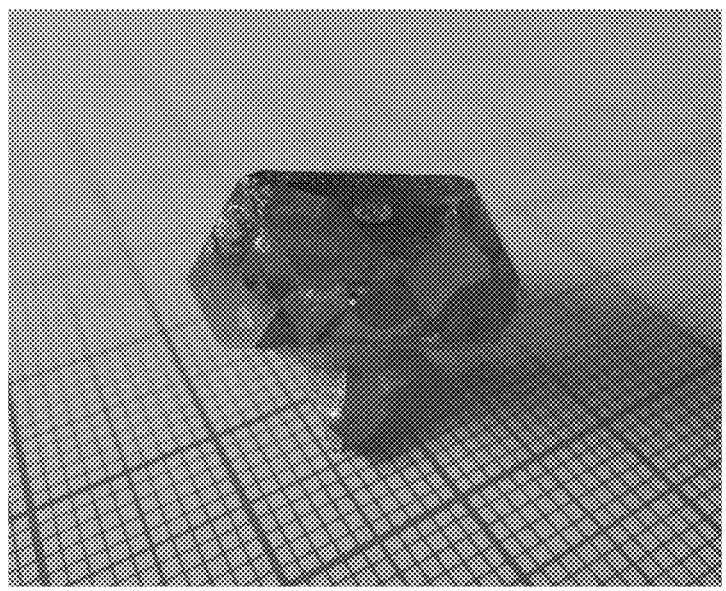
FIG. 5 is a picture of a titanium tellurite single crystal prepared according to Embodiment 4.

Compounding the raw materials $TiO_2$ and $TeO_2$ according to the $TiTe_3O_8$ stoichiometric ratio, adding them to a flux system $TeO_2$, where the mole rate between the titanium tellurite and the flux system is 1:3, placing them into a platinum crucible with a volume of Φ50 mm×70 mm, rapidly heating to 980° C. to completely melt the raw materials, homogeneously stirring; slowly cooling to the saturation point of the solution; performing crystal growth with a crystal along [100] direction as the seed crystal, wherein the cooling rate is 0.05° C./h and the growth period is 40 days, thereby obtaining a bulky single crystal (as shown in FIG. 5). Testing on the experimental X-ray powder diffraction pattern shows a coincidence with the result derived from theoretical computation, indicating that what is obtained is the titanium tellurite crystal of the cubic crystal system.

Embodiment 5: Growth of Yb: $TiTe_3O_8$ Single Crystal

Compounding the raw materials $TiO_2$ and $TeO_2$ according to the $TiTe_3O_8$ stoichiometric ratio, adding them together with $Yb_2O_3$ to a flux system $TeO_2$, wherein the mole rate between $Yb_2O_3$ and the flux system is 0.05:1, and the mole rate between the titanium tellurite and the flux system is 1:3; placing them into a platinum crucible with a volume of Φ50 mm×70 mm, rapidly heating to 1100° C. to completely melt the raw materials, homogeneously stirring; slowly cooling to the saturation point of the solution; performing crystal growth with a crystal along [100] direction as the seed crystal, wherein the cooling rate is 0.04° C./h and the growth period is 50 days, thereby obtaining a Yb: $TiTe_3O_8$ bulky single crystal.

Figure 6:
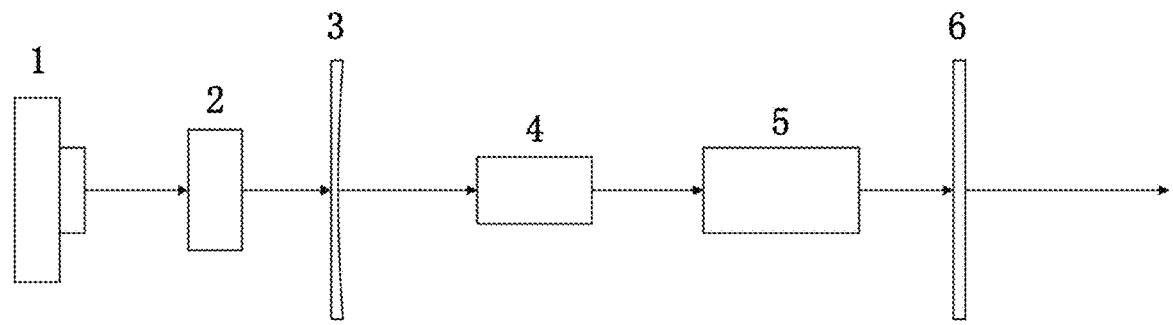
FIG. 6 is an operating schematic diagram of typical acousto-optic crystal Q switching.

Embodiment 6: Application of Titanium Tellurite Single Crystal as Acousto-Optic Crystal The operating schematic diagram of fabricating an acousto-optic Q switching device using the titanium tellurite single crystal grown according to embodiment 3 is shown in FIG. 6. 1 represents a laser diode, whose output light is focused by a focusing system 2 onto the Nd: YVO4/Nd: YAG laser crystal 3. The resonant cavity employs a plano-concave structure, and the acousto-optic medium 5 employs a titanium tellurite single crystal.

Figure 7:
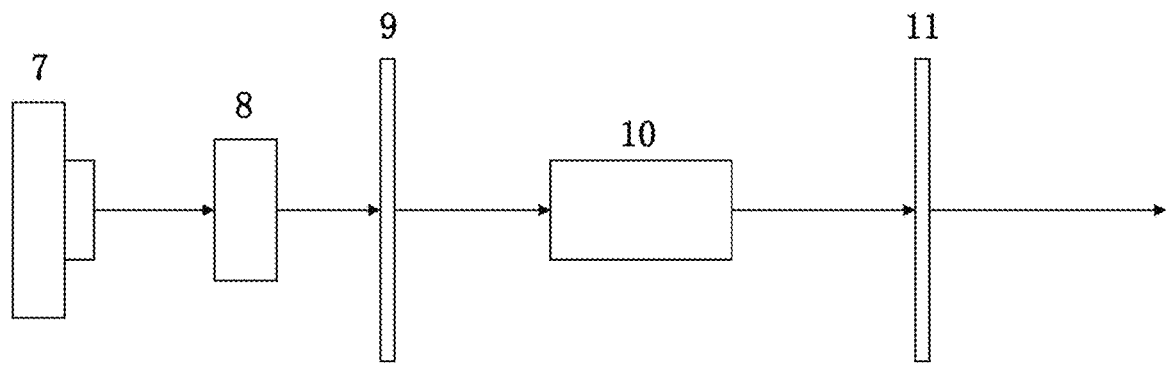
FIG. 7 is an operating schematic diagram of a typical laser crystal.

Embodiment 7: Application of Using the Yb: $TiTe_3O_8$ Single Crystal as the Laser Crystal The operating schematic diagram of fabricating a laser device using the Yb: $TiTe_3O_8$ single crystal grown according to embodiment 5 is shown in FIG. 7. 7 represents a laser diode, whose output light is focused by a focusing system 8 onto the Yb: $TiTe_3O_8$ laser crystal 10.

Figure 8:
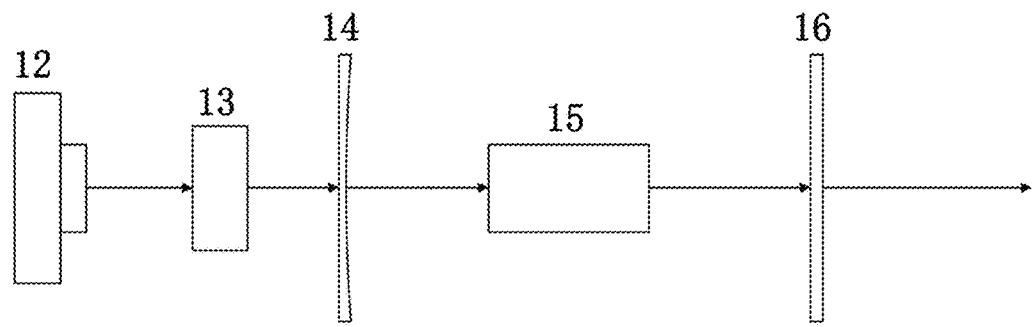
FIG. 8 is an operating schematic diagram of a typical laser self-Q switching crystal.

Embodiment 8: Application of Using the Yb: $TiTe_3O_8$ Single Crystal as the Laser Self-Q Switching Crystal The operating schematic diagram of fabricating a laser self-Q switching crystal using the Yb: $TiTe_3O_8$ single crystal grown according to embodiment 5 is shown in FIG. 8. 12 represents a laser diode, whose output light is focused by a

Embodiment 9: Growth of Zirconium Tellurite Single Crystal

Compounding the raw materials $ZrO_2$ and $TeO_2$ according to the $ZrTe_3O_8$ stoichiometric ratio, adding them to a flux system $TeO_2$, where the mole rate between the zirconium tellurite and the flux system is 1:4, placing them into a platinum crucible with a volume of Φ50 mm×70 mm, rapidly heating to completely melt the raw materials, stirring sufficiently homogeneously; cooling slowly to the saturation point of the solution; performing crystal growth with a crystal along [100] direction as the seed crystal, wherein the cooling rate is 0.02° C./h and the growth period is 40 days, thereby obtaining a zirconium tellurite single crystal. Testing of the experimental X-ray powder diffraction pattern shows a coincidence with the result derived from theoretical computation, indicating that what is obtained is a zirconium tellurite crystal of the cubic crystal system.

Embodiment 10: Growth of Hafnium Tellurite Single Crystal

Compounding the raw materials $HfO_2$ and $TeO_2$ according to the $HfTe_3O_8$ stoichiometric ratio, adding them to a flux system $Li_2CO_3$—$TeO_2$ (the $Li_2CO_3$:$TeO_2$ mole rate is 2:3), where the mole rate between hafnium tellurite and the flux system is 1:4, placing them into a platinum crucible with a volume of Φ50 mm×70 mm, rapidly heating to completely melt the raw materials, stirring sufficiently and homogeneously; slowly cooling to the saturation point of the solution; performing crystal growth with a crystal along [100] direction as the seed crystal, wherein the cooling rate is 0.02° C./h and the growth period is 60 days, thereby obtaining a hafnium tellurite single crystal. Testing of the experimental X-ray powder diffraction pattern shows a coincidence with the result derived from theoretical computation, indicating that what is obtained is a hafnium Tellurite crystal of the cubic crystal system.

What is claimed is:

1. A growing method of a tellurite crystal having a chemical formula of $MTe_3O_8$, wherein M=Ti, Zr, Hf, which belongs to an Ia-3 space group of a cubic crystal system, and wherein a transmittance waveband ranges from visible light to infrared light, with a transparency ≥70%, wherein the crystal is grown using a flux method, the growing method comprising steps of:

(1) compounding raw materials $MO_2$ (M=Ti, Zr, Hf) and $TeO_2$ according to an $MTe_3O_8$ stoichiometric ratio, homogeneously mixing and tableting, sintering at 500° C.~650° C. for 20~40 h, cooling, grinding, and then sintering at 600~700° C. for 20~40 h, obtaining a pure-phase tellurite polycrystal; adding the pure-phase tellurite polycrystal to a flux system, then obtaining a crystal growth material;

or, compounding raw materials $MO_2$ (M=Ti, Zr, Hf) and $TeO_2$ according to an $MTe_3O_8$ stoichiometric ratio, directly adding them to the flux system, homogeneously mixing, thereby obtaining a crystal growth material;

wherein the flux system is selected from one of the following substances, but not limited thereto:
(a) $TeO_2$;
(b) $A_2CO_3$—$TeO_2$ (A=Li, Na, K, Rb or/and Cs), wherein the mole ratio between $M_2CO_3$ and $TeO_2$ is 2: (1~5);
(c) $MoO_3$;
(d) $B_2O_3$;
(e) PbO—$B_2O_3$;
wherein the mole ratio between the tellurite and the flux system is 1: (1~5);

(2) putting the crystal growth material obtained in step (1) in a platinum crucible, heating to melt it completely, stirring homogeneously, cooling to facilitate the crystal to be nucleated spontaneously and to grow to obtain a tellurite seed crystal;

putting the crystal growth material obtained in step (1) in a platinum crucible, heating to melt it completely, stirring homogeneously, cooling to a saturation point of the solution, feeding the tellurite seed crystal to perform crystal transformation, cooling to facilitate the crystal to grow;

wherein a temperature range for the crystal growth is 750~900° C., and a cooling rate is 0.01~5° C./h.

2. The growing method of the tellurite crystal of claim 1, wherein a cooling procedure during growing of the tellurite crystal in step (2) comprises: cooling to 750~850° C. at a rate of 0.01~4° C./h with a growth period: 5~70 days.

3. The growing method of the tellurite crystal of claim 1, wherein a grown tellurite single crystal has a length ≥20 mm and a thickness ≥10 mm.

4. The growing method of the tellurite crystal of claim 1, wherein in the step (1), a rare earth element material $Re_2O_3$, the $MO_2$ (M=Ti, Zr, Hf), and the $TeO_2$ are compounded together according to a certain proportion, obtaining a rare earth element-doped crystal growth material, and growth through the step (2) results in a rare earth element-doped tellurite crystal.

* * * * *